(12) United States Patent  
Dono et al.

(10) Patent No.: US 7,301,844 B2  
(45) Date of Patent: Nov. 27, 2007

(54) SEMICONDUCTOR DEVICE

(75) Inventors: Chiaki Dono, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/443,348

(22) Filed: May 31, 2006

(65) Prior Publication Data

US 2007/0008799 A1 Jan. 11, 2007

(30) Foreign Application Priority Data

Jun. 1, 2005 (JP) ............................... 2005-160948

(51) Int. Cl.  
*G11C 7/00* (2006.01)

(52) U.S. Cl. ............. 365/222; 365/189.07; 365/230.03

(58) Field of Classification Search ................. 365/222  
See application file for complete search history.

(56) References Cited

U.S. PATENT DOCUMENTS 5,305,274 A * 4/1994 Proebsting ................... 365/222
6,097,662 A * 8/2000 Itou ........................ 365/230.03
6,850,449 B2 * 2/2005 Takahashi .................... 365/222
7,068,558 B2 * 6/2006 Cho ............................. 365/222
7,072,237 B2 * 7/2006 Morgan et al. ............. 365/222
7,139,208 B2 * 11/2006 Arimoto et al. ............ 365/222
7,215,589 B2 * 5/2007 Dono et al. ................. 365/222
2004/0076054 A1 * 4/2004 Takahashi .................... 365/200
2006/0262625 A1 * 11/2006 Dono et al. ................. 365/222

FOREIGN PATENT DOCUMENTS

| JP | 4-10297 A | 1/1992 |
| JP | 8-306184 A | 11/1996 |
| JP | 2005-116106 A | 4/2005 |

* cited by examiner

*Primary Examiner*—Son L. Mai  
(74) *Attorney, Agent, or Firm*—Sughrue Mion Pllc.

(57) ABSTRACT

In a semiconductor device, an internally-generated power supply voltage VPP is monitored. If the internally-generated power supply voltage VPP is lower than a lower limit voltage, serial refresh is selected as a double refresh operation mode. In the serial refresh, double refresh for a pair address is inserted in a next refresh cycle. By the serial refresh, decrease of the internally-generated power supply voltage VPP is suppressed.

7 Claims, 4 Drawing Sheets

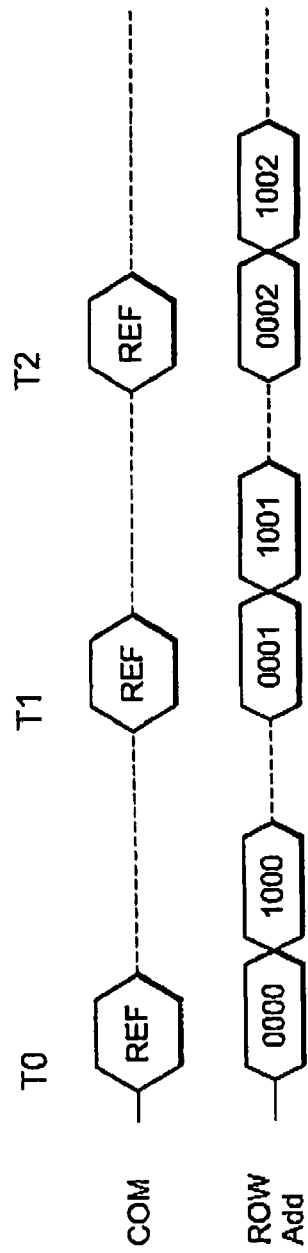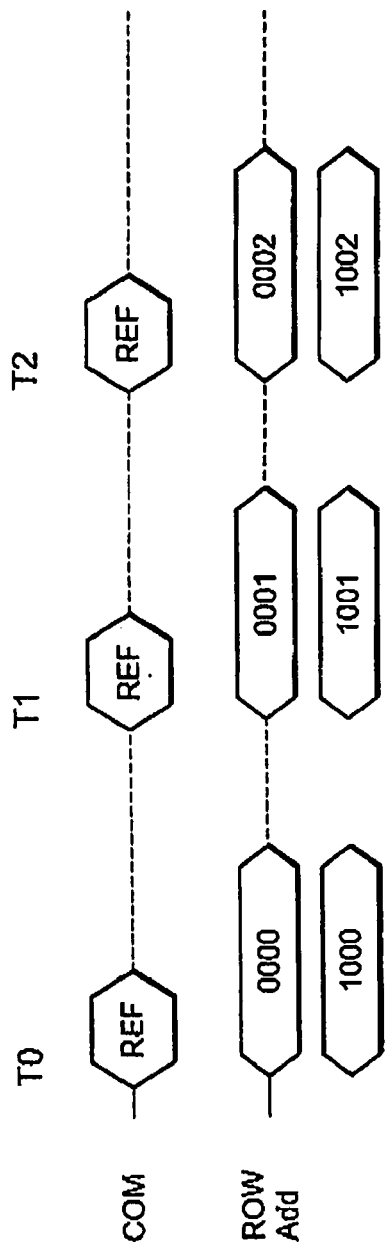

SEMICONDUCTOR DEVICE

This application claims priority to prior Japanese patent application JP 2005-160948, the disclosure of which is incorporated herein by reference.

BACKGROUND OF THE INVENTION

This invention relates to a semiconductor device and, in particular, to a semiconductor device in which a double refresh operation mode is changed with reference to an internally-generated power supply voltage VPP (hereinafter will simply be referred to as a power supply voltage VPP) a power supply voltage level upon refreshing and relieving a memory cell.

As a semiconductor device, a dynamic random access memory (hereinafter referred to as "DRAM") having a large capacity and randomly accessible is known. The DRAM holds memory information as electric charges stored in capacitors of memory cells. It is therefore required to perform a refresh operation by reading the memory information before the electric charges fade away, amplifying the memory information, and restoring the memory information into its original state. The electric charges stored in the capacitors of the memory cells in the DRAM fade away after lapse of certain time periods which may be called information holding times or retention times. The retention times are different from cell to cell and are not constant.

The retention times are continuously distributed from a short retention time to a long retention time. This is mainly because the electric charges as "HIGH level" written in the memory cells fade away due to junction leakage. The retention times are also affected by surface leakage and relationships with adjacent cells. In the DRAM, the retention times are long in most of the memory cells and are short in only a part of the memory cells. Those cells having short retention times are replaced by redundant memory cells to be relieved. However, due to the limitation in number of redundant circuits (that is, the redundant memory cells), some of the memory cells having short retention times may be kept present without being relieved.

In presence of the memory cells having short retention times, the semiconductor device is rejected as a defective product below standard. This results in a low production yield and a high production cost. In view of the above, proposal is made of a technique of relieving all memory cells having short retention times by providing a large number of redundant circuits. However, in case where a large number of redundant circuits are provided, the semiconductor device is inevitably increased in chip area. After all, the production cost is increased.

In order to overcome the above-mentioned problems, several techniques have been proposed as will presently be described. According to these techniques, the memory cells having short retention times are refreshed in a short cycle so as to be relieved without being replaced by the redundant circuits. For example, Japanese Unexamined Patent Application Publication (JP-A) No. H4-10297 discloses a semiconductor device in which particular cells having short retention times are refreshed more frequently as compared with other cells. Japanese Unexamined Patent Application Publication (JP-A) No. H08-306184 discloses a semiconductor device in which a fuse circuit group memorizes addresses of memory cells having short retention times. Each memory cell is refreshed in a long cycle or a short cycle depending upon its retention time. For those memory cells specified to have long retention times, a short-cycle refresh operation is skipped. Thus, a short-cycle or a long-cycle refresh operation is performed in accordance with fuse circuit information.

Japanese Unexamined Patent Application Publication (JP-A) No. 2005-116106 discloses double refresh as means for relieving the memory cells having short data retention times. Referring to FIGS. 1A and 1B, the double refresh will be described. In the double refresh, two word lines are activated and refreshed by one refresh command. For example. it is assumed that a refresh command is supplied at a time instant T0 to refresh a word line "0000". In this event, judgment is made about whether or not a pair word line "1000" paired with the word line "0000" has a short data retention time (i.e., the pair word line "1000" is connected to an array containing a memory cell having a short data retention time). If it is judged that the pair word line "1000" has a short data retention time, the word line "0000" and the pair word line "1000" are simultaneously activated and refreshed.

The pair word line "1000" is refreshed twice, i.e., when the word line "0000" is refreshed and when the pair word line "1000" itself is refreshed. Therefore, the pair word line "1000" having a short data retention time is refreshed in a short cycle which corresponds to a half of a normal refresh cycle. The pair word line "1000" having a short data retention time is relieved by being refreshed in a short refresh cycle. In the following description, a row address "0000" and the word line "0000" will be understood to have the same meaning because the word line is selected by the row address.

As the double refresh, a time-division double refresh operation mode shown in FIG. 1A is known. In the time-division double refresh operation mode, a refresh cycle is time-divided into a first half and a second half as timings at which two word lines are activated upon carrying out the double refresh. Further, a parallel double refresh operation mode shown in FIG. 1B is known. In the parallel double refresh operation mode, two word lines are simultaneously activated in the refresh cycle upon carrying out the double refresh. In case where the pair word line has a data retention time longer than a normal data retention time, the pair word line is not refreshed. One of the above-mentioned double refresh operation modes is preliminarily selected as a desired operation mode at a design stage or upon wafer delivery.

In the above-mentioned double refresh operation modes, the two word lines are activated in one refresh cycle. It is further assumed that two adjacent word lines have short data retention times. In this event, it is necessary to increase a supply capacity of a VPP power supply circuit for generating a power supply voltage VPP, which is generated in the semiconductor device by stepping up an external supply voltage and supplied to the word lines, to a level twice that required in a normal refresh operation. Accordingly, the VPP power supply circuit is inevitably increased in area. This results in an increase in chip cost.

As described above, the semiconductor device has a problem that, because of presence of the memory cells having short retention times, the yield is decreased. In case where the double refresh is applied, the power supply voltage is significantly lowered inside a chip and the VPP power supply circuit requires an area twice that required in the normal refresh operation. This results in an increase in chip cost.

SUMMARY OF THE INVENTION

It is therefore an object of this invention to provide a double refresh operation mode corresponding to a voltage level of a power supply voltage generated by a VPP power supply circuit. More specifically, it is an object of this invention to provide a semiconductor device capable of relieving memory cells having short retention times by monitoring a voltage level of a power supply voltage VPP generated by a VPP power supply circuit inside a chip, changing a double refresh operation mode with reference to the voltage level, and suppressing a decrease in voltage level.

Semiconductor devices according to this invention are as follows:

(1) A semiconductor device to which double refresh is applied, wherein a double refresh operation mode of said double refresh is changed with reference to a voltage level of a power supply voltage internally generated in said semiconductor device.

(2) A semiconductor device according to (1), comprising a level detection circuit for comparing the voltage level of the power supply voltage internally generated and a lower limit voltage as a reference level to produce a refresh control signal, and a double refresh control circuit for changing the double refresh operation mode in response to the refresh control signal from the level detection circuit.

(3) A semiconductor device according to (1), further comprising an address selector, wherein an address selected by the address selector and a pair address are refreshed in a cycle started by input of a refresh command in case where the voltage level of the power supply voltage internally generated is higher than the lower limit value, the address selected by the address selector and the pair address being refreshed in the cycle started by input of the refresh command and in a next cycle started by input of a next refresh command, respectively, in case where the voltage level of the power supply voltage is lower than the lower limit voltage.

(4) A semiconductor device according to (3), wherein the address selected by the address selector and the pair address are refreshed in a first half and a second half of the cycle started by input of the refresh command, respectively, in case where the voltage level of the power supply voltage internally generated is higher than the lower limit voltage.

(5) A semiconductor device according to (3), wherein the address selected by the address selector and the pair address are refreshed simultaneously in the cycle started by input of the refresh command in case where the voltage level of the power supply voltage internally generated is higher than the lower limit voltage.

(6) A semiconductor device according to (3), further comprising a fuse circuit group which memorizes addresses requiring the double refresh, the fuse circuit group comparing the address selected by the address selector and the addresses memorized in the fuse circuit group to produce a hit signal in case where the pair address of the address selected by the address selector requires the double refresh.

(7) A semiconductor device according to (6), further comprising a refresh counter, wherein the double refresh control circuit is supplied with the hit signal and the refresh control signal to produce a hold signal for stopping a count-up operation of the refresh counter in case where the voltage level of the power supply voltage internally generated is lower than the lower limit value.

In a semiconductor device to which double refresh is applicable, a voltage level of a power supply voltage VPP generated by a VPP power supply circuit inside a chip is monitored and an optimum double refresh operation mode is determined with reference to the voltage level. Thus, it is possible to suppress a decrease in voltage level of the power supply voltage VPP and to improve refresh characteristics in the double refresh.

BRIEF DESCRIPTION OF THE DRAWING

FIG. 1A is a timing chart for describing an existing time-division refresh mode;

FIG. 1B is a timing chart for describing an existing parallel refresh mode;

DESCRIPTION OF THE PREFERRED EMBODIMENTS

Figure 2:
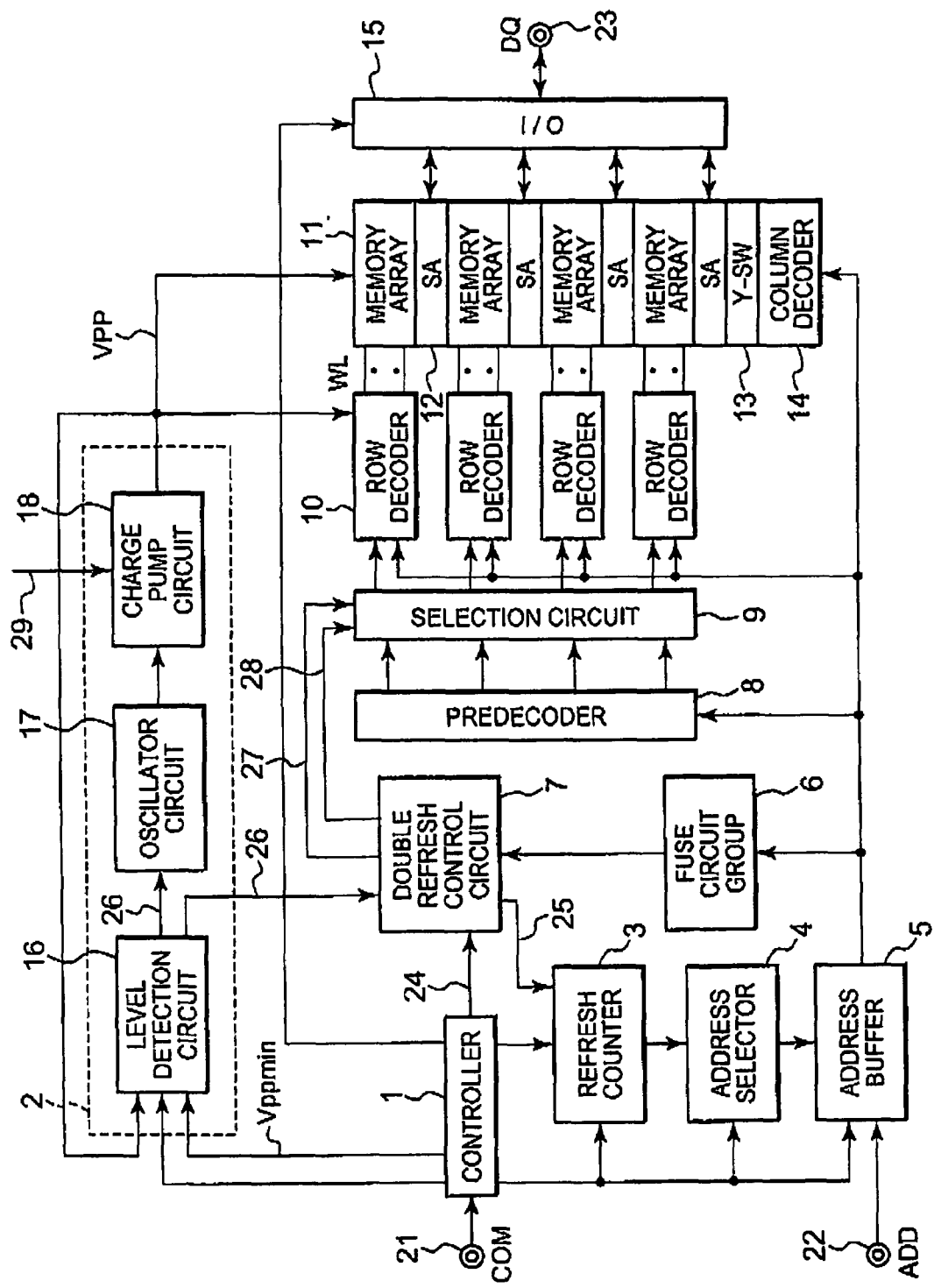
FIG. 2 is a schematic block diagram of a semiconductor device according to this invention.

Now, embodiments of this invention will be described with reference to the drawing.

First Embodiment

Figure 3:
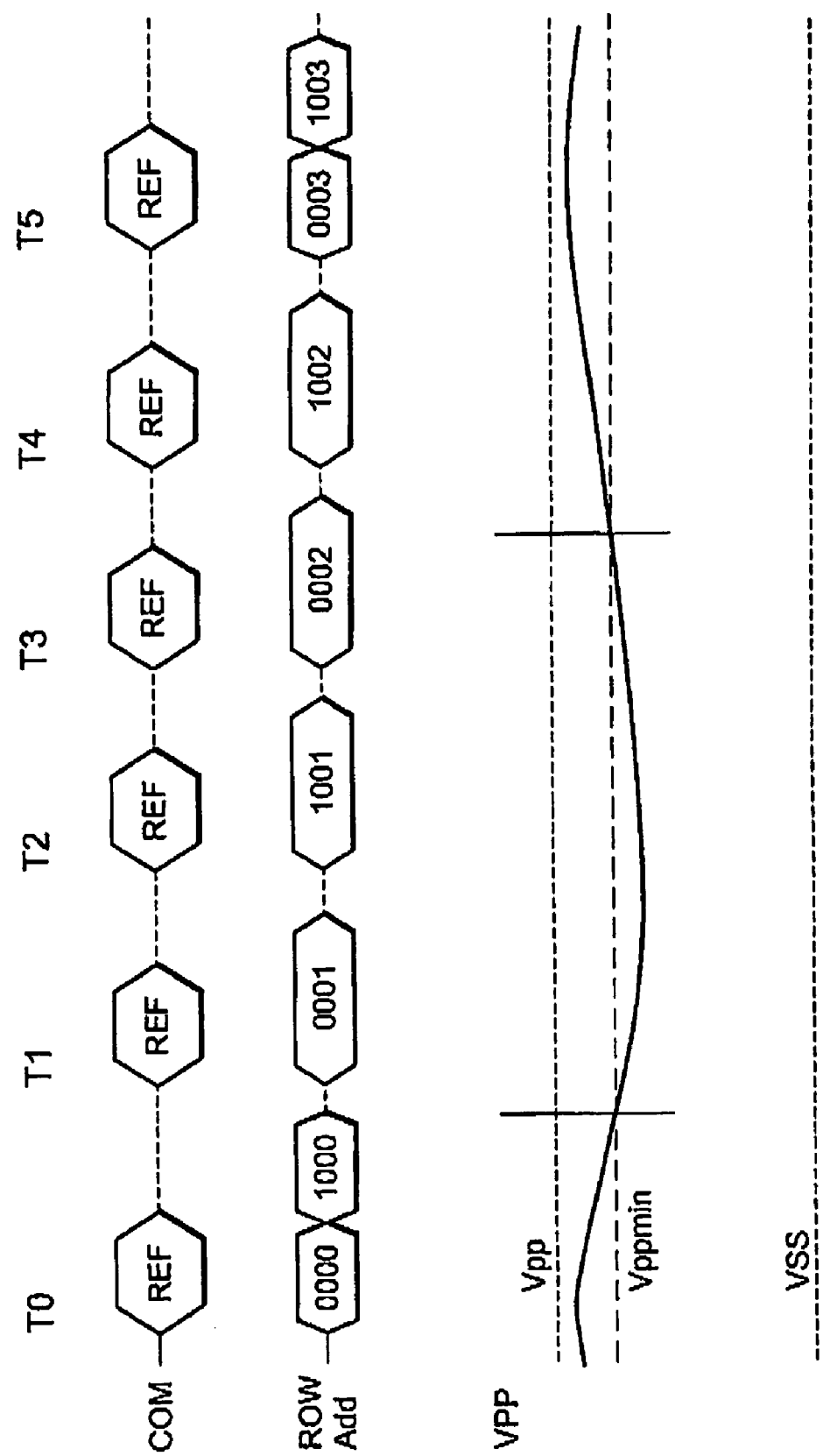
FIG. 3 is a timing chart for describing double refresh according to a first embodiment of this invention.

Referring to FIGS. 2 and 3, a first embodiment of this invention will be described. In this embodiment, time-division refresh or serial refresh is selectively carried out as a double refresh operation mode. In case where a power supply voltage VPP generated by a VPP power supply circuit is not lower than a predetermined voltage, time-division refresh is carried out. In the time-division refresh, one refresh cycle is time-divided and refresh operations are carried out for a particular word line and a pair word line in the one refresh cycle. In case where the power supply voltage VPP is lower than the predetermined voltage, serial refresh is performed in which a refresh operation for a particular word line is performed in one refresh command cycle and a refresh operation for a pair word line is inserted in a next refresh command cycle.

At first referring to FIG. 2, a semiconductor device according to this invention will be described. In FIG. 2, a part of a structure of the semiconductor device similar to that of a typical semiconductor device is omitted for simplicity of illustration. The semiconductor device illustrated in the figure comprises a controller 1, a VPP power supply circuit 2, a refresh counter 3, an address selector 4, an address buffer 5, a fuse circuit group 6, a double refresh control circuit 7, a predecoder 8, a selection circuit 9, a plurality of row decoders 10, a plurality of memory arrays 11, a plurality of sense amplifiers 12, a Y (column) switch 13, a column decoder 14, and an I/O (input/output) circuit 15. The VPP power supply circuit 2 comprises a level detection circuit 16, an oscillator circuit 17, and a charge pump circuit 18.

The controller 1 decodes a command COM supplied from an external input terminal 21 and sends a control signal to internal circuits in accordance with the command to control various kinds of operations of the semiconductor device. The VPP power supply circuit 2 steps up an external supply voltage 29 and generates an internally-generated power supply voltage VPP (hereinafter will simply be referred to as a power supply voltage VPP) for use in a word line driver and the like. The level detection circuit 16 of the VPP power supply circuit 2 compares a reference voltage (herein, corresponding to a lower limit voltage Vppmin) from the controller 1 and the power supply voltage VPP and, if the power supply voltage VPP is not higher than the reference voltage, sends a refresh control signal 26 to the oscillator circuit 17 and the double refresh control circuit 7. Supplied with the control signal 26, the oscillator circuit 17 sends a clock signal to the charge pump circuit 18. Supplied with the clock signal from the oscillator circuit 17, the charge pump circuit 18 steps up the external supply voltage to produce the power supply voltage VPP and supplies the power supply voltage VPP to the internal circuits. The VPP power supply circuit 2 has a basic structure similar to a typical circuit structure and further comprises the level detection circuit 16 for comparing the reference voltage and the power supply voltage VPP to produce the refresh control signal 26.

The refresh counter 3 counts up the number of refresh commands REF supplied thereto and sends a count signal representative of a counted number to the address selector 4. When the counted number reaches a predetermined number, the refresh counter 3 is reset and then starts to count up again. The address selector 4 is supplied with the count signal from the refresh counter 3 and automatically produces an address to be refreshed. The address buffer 5 is supplied with an address (ADD) from an external input terminal 22 or the address from the address selector 4 and delivers the address to the predecoder 8, the row decoders 10, the column decoder 14, and the fuse circuit group 6.

The fuse circuit group 6 memorizes row addresses of memory cells having short retention times and requiring short-cycle double refresh. The fuse circuit group 6 is supplied with the address from the address buffer 5 as an input address and judges whether or not a pair address for the input address is coincident with any one of the row addresses memorized as addresses to be subjected to double refresh. Supplied with the signals from the controller 1, the level detection circuit 16, and the fuse circuit group 6, the double refresh control circuit 7 controls the refresh counter 3 and the selection circuit 9 to select an optimum double refresh operation mode. The predecoder 8 is a part of the row decoders 10 and selects respective blocks of the memory arrays 11. Supplied with outputs of the predecoder 8 as well as control signals INT 27 and MULTI 28 from the double refresh control circuit 7, the selection circuit 9 controls the row decoders 10.

In response to the address signal supplied thereto and a signal from the selection circuit 9, the row decoders 10 activate word lines of the memory arrays 11, respectively. Each of the memory arrays 11 has a plurality of memory cells arranged in a matrix fashion. The memory cells are arranged at intersecting points of the word lines and bit lines. The memory cells must be refreshed at every predetermined period. The bit lines are connected to the sense amplifiers (SA) 12. Each of the sense amplifiers SA 12 transmits and receives data to and from the I/O circuit 15 by the Y switch (Y-SW) 13 selected by the column decoder 14. The I/O circuit 15 transmits and receives data to and from an external circuit via a DQ pin 23.

The memory arrays 11 and the row decoders 10 are separated into four blocks. For example, a total number of the word lines is equal to 8192 and each block comprises 2048 word lines. The first through the fourth blocks comprise the word lines 0000-2047, the word lines 2048-4095, the word lines 4096-6143, and the word lines 6144-8191, respectively. In normal refresh, the word lines are successively activated in response to the refresh commands REF and refreshed in every refresh cycle of 64 mn.

For example, if the memory array connected to the word line 0003 has a short retention time and requires short-cycle refresh, the word line 0003 is refreshed not only at its refresh timing but also at a refresh timing of the word line 4099 (4096 + 0003). In this manner, refresh is performed in a short cycle of 32 ms corresponding to a half of a normal refresh cycle. The memory array having a short retention time can be relieved by the short-cycle refresh. Those word lines having such a relationship as a combination of the word line 0003 and the word line 4099 (4096 + 0003) may be called pair word lines.

Further, the word line 0003 may be refreshed not only at its refresh timing but also at refresh timings of the word line 2051 (2048 + 0003), the word line 4099 (2048 × 2 + 0003), and the word line 6147 (2048 × 3 + 0003). In this manner, refresh is performed at every 16 ms corresponding to 1/4 of the normal refresh cycle. In order to perform such double refresh, the word line to be refreshed according to the address automatically generated by the address selector 4 and the pair word line are included in different blocks and refreshed simultaneously. Therefore, in case of the short-cycle refresh of 1/2, two or more blocks are required. In case of the short-cycle refresh of 1/4, four or more blocks are required. In FIG. 2, the memory arrays 11 and the row decoders 10 are separated into four blocks. However, the arrangement of the blocks is not restricted to the illustrated example.

The word line to be refreshed and the pair word line are included in different blocks and do not share the same sense amplifier. These word lines are simultaneously refreshed as the short-cycle refresh. In the following description, it is assumed that the double refresh is carried out as 1/2 short-cycle refresh and those word lines with their uppermost address bits inverted from each other are pair word lines. For example, the word line "0003" and the word line "1003" are paired. If the address automatically generated by the address selector 4 is "1003", the pair address is "0003". Since the word line is defined by the address, the address "0003" and the word line "0003" are synonymous.

FIG. 3 shows refresh commands REF as commands (COM), row addresses (ROW Add) selected upon input of the refresh commands REF, and the power supply voltage VPP. At a time instant T0, a first refresh command REF is supplied and the word line "0000" is refreshed. Judgment is made about whether or not the pair word line "1000" for the word line "0000" has a short retention time and is to be subjected to the double refresh. Herein, the pair word line "1000" is to be subjected to the double refresh and the double refresh is performed.

At the time instant T0, the power supply voltage VPP is higher than the lower limit voltage Vppmin of a predetermined design value Vpp. Therefore, the word line "0000" and the pair word line "1000" are refreshed in a first half and a second half of one refresh cycle, respectively, in a time-division fashion. Herein, the double refresh in which the pair addresses are refreshed in the same cycle in the time-division fashion is called the time-division refresh. In this cycle, two word lines, i.e., the word line "0000" and the pair word line "1000" are activated and refreshed. Therefore, a voltage level of the power supply voltage VPP is decreased to become lower than the lower limit voltage Vppmin. As a consequence, the refresh control signal 26 from the level detection circuit 16 changes from a "H" level into a "L" level.

At a time instant T1, a second refresh command REF is supplied and the word line "0001" is refreshed. Judgment is made about whether or not the pair word line "1001" for the word line "0001" has a short retention time and is to be subject to the double refresh. Herein, the pair word line "1001" is to be subjected to the double refresh and the double refresh is performed. However, at the time instant T1, the power supply voltage VPP is lower than the lower limit voltage Vppmin and the refresh control signal 26 has a "L" level. Therefore, the serial refresh is selected as the double refresh operation mode. In a second refresh cycle, the word line "0001" alone is refreshed while the refresh operation of the pair word line "1001" is suspended or withheld. At this time, the refresh counter 3 is stopped in response to a hold signal 25 from the double refresh control circuit 7.

At a time instant T2, a third refresh command REF is supplied. Normally, the word line "0002" is refreshed. However, the refresh counter 3 stops a count-up operation in response to the hold signal 25 from the double refresh control circuit 7. Therefore, the address selector 4 produces the former address "0001" without counting up. Therefore, the double refresh operation of the pair word line "1001", which is withheld in the second refresh cycle, is performed to refresh the pair word line "1001". Since the pair word line "1001" is double-refreshed, the hold signal 25 from the double refresh control circuit 7 is inactivated. The above-mentioned operation in which the double refresh of the pair word line is inserted into the next refresh cycle to refresh the pair word line is called the serial refresh.

At a time instant T3, a fourth refresh command REF is supplied and the word line "0002" is refreshed. The pair word line "1002" for the word line "0002" is to be subjected to the double refresh and the double refresh is performed. However, at the time instant T3, the power supply voltage VPP is kept lower than the lower limit voltage Vppmin. Therefore, the serial refresh is selected as the double refresh operation mode. In a fourth refresh cycle, the word line "0002" alone is refreshed and the refresh operation of the pair word line "1002" is withheld. The refresh counter 3 is stopped again in response to the hold signal 25 from the double refresh control circuit 7. During the fourth refresh cycle, the power supply voltage VPP is recovered to the level of the lower limit voltage Vppmin. Consequently, the refresh control signal 26 from the level detection circuit 16 is changed into a "H" level.

At a time instant T4, a fourth refresh command REF is supplied. Normally, the word line "0003" is refreshed. However, the refresh counter 3 stops the count-up operation in response to the hold signal 25 from the double refresh control circuit 7. Therefore, the address selector 4 produces the address "0002". The double refresh operation of the pair word line "1002", which is withheld in the third refresh cycle, is inserted to refresh the pair word line "1002". Since the pair word line "1002" is double-refreshed, the hold signal 25 from the double refresh control circuit 7 is inactivated.

At a time instant T5, a sixth refresh command REF is supplied and the word line "0003" is refreshed. The pair word line "1003" for the word line "0003" is to be subjected to the double refresh and the double refresh is performed. At the time instant T5, the power supply voltage VPP is recovered to a level higher than the lower limit voltage Vppmin of the predetermined design value. Therefore, the word line "0003" and the pair word line "1003" are refreshed in a first half and a second half of a sixth refresh cycle, respectively, in a time-division fashion.

As described above, the pair word line having a short retention time is subjected to the double refresh by the use of the time-division refresh and the serial refresh as the double refresh operation mode if the power supply voltage VPP is higher and lower than the lower limit voltage Vppmin, respectively. By selecting the serial refresh when the power supply voltage VPP is low, the power supply voltage VPP is recovered and a decrease of the power supply voltage VPP is suppressed. Thus, the double refresh operation mode is changed depending upon the power supply voltage VPP. By changing the double refresh operation mode and suppressing the decrease of the power supply voltage VPP, memory cells having short retention times are relieved.

Turning back to FIG. 2, description will be made of an operation of each circuit block of the semiconductor device at each timing. At the time instant T0, the first refresh command REF is supplied and the controller 1 produces a refresh operation command. In response to a count signal from the refresh counter 3, the address selector 4 produces the address to be refreshed. In FIG. 3, the first address "0000" is produced and sent to the address buffer 5. The address buffer 5 supplies the address to the fuse circuit group 6, the predecoder 8, and the row decoders 10.

The fuse circuit group 6 compares the input address and address information programmed in fuses. In case where a particular word line having a pair address for the input address requires the double refresh, a hit signal is activated. In case of the normal refresh, the hit signal is kept inactive. In case of the address "0000", the pair address "1000" requires the double refresh. Therefore, the hit signal is activated. Supplied with the activated hit signal, the double refresh control circuit 7 supplies the control signals INT 27 and MULTI 28 to the selection circuit 9. The control signals INT 27 and MULTI 28 are signals for control selection of the refresh operation mode.

At the time instant T0 in FIG. 3, the power supply voltage VPP is higher than the lower limit voltage Vppmin of the predetermined design value. The refresh control signal 26 from the level detection circuit 16 has a "H" level. Therefore, the time-division refresh is selected. The time-division refresh is selected, for example, by producing the control signal INT 27 of a "H" level and MULTI 28 of a "H" level. By the selection circuit 9 and the row decoders 10, the word line "0000" is activated and refreshed. Subsequently, the pair word line "1000" is activated and refreshed. The word line "0000" and the pair word line "1000" are refreshed in the first half and the second half of the first refresh cycle, respectively, in the time-division fashion. Herein, the pre-decoder 8 produces an output indicative of non-selection of the block having the pair word line "1000" but the block is selected by the selection circuit 9. Therefore, the control signals INT 27 and MULTI 28 may be directly supplied to the predecoder 8.

In the first refresh command cycle, the refresh operations are carried out twice. Generally, the supply capacity of the VPP power supply circuit is designed in correspondence to a single refresh operation in a single refresh command cycle. Herein, the refresh operations are carried out twice. Therefore, current consumption exceeds the supply capacity of the VPP power supply circuit so that the power supply voltage VPP is lowered below the lower limit voltage Vppmin of the design value. Since the power supply voltage VPP is lowered below the lower limit voltage Vppmin of the design value, the refresh control signal 26 from the level detection circuit 16 is changed into a "L" level. The lower limit voltage Vppmin of the design value is a power supply voltage at which the refresh operation is carried out although high-speed operations (write and read operations) of the semiconductor device are deteriorated.

After lapse of a predetermined time period, the second refresh time instant T1 is reached. The controller 1 supplied with the second refresh command REF makes the refresh counter 3 perform the count-up operation. The refresh counter 3 supplies the count signal to the address selector 4. The address selector 4 increments the address and designates the address "0001". The address "0001" is sent to the address buffer 5. The address buffer 5 sends the address to the fuse circuit group 6, the predecoder 8, and the row decoders 10.

The fuse circuit group 6 compares the input address and the address information programmed in the fuses. In case of the input address "0001", the pair address "1001" requires the double refresh. Therefore, the hit signal is activated. The double refresh control circuit 7 supplied with the activated hit signal delivers the control signals INT 27 and MULTI 28 to the selection circuit 9. Herein, since the power supply voltage VPP is lower than the lower limit voltage Vppmin, the serial refresh is selected. Because of the serial refresh, the hold signal 25 is activated and sent to the refresh counter 3.

The serial refresh is related to two refresh commands. Therefore, the double refresh control circuit 7 holds serial refresh information until the next refresh command is supplied and the refresh operation is completed. In the first refresh command cycle, the word line "0001" corresponding to the input address is refreshed. In the next refresh command cycle, the pair word line "1001" is refreshed. Therefore, at the time instant T1, the control signals INT 27 of a "L" level and MULTI 28 of a "L" level are produced. The word line "0001" is activated and refreshed while the refresh operation of the pair word line "1001" is withheld. In this refresh command cycle, a single refresh operation is performed so that the power supply voltage VPP, which has been lowered, is stepped up or increased.

After lapse of the predetermined time period, the third refresh time instant T2 is reached. The third refresh command REF is supplied but the refresh counter 3 performs no count-up operation in response to the hold signal 25. Therefore, the address selector 4 does not increment the address and delivers the address "0001" without change. The address "0001" is sent to the address buffer 5. The address buffer 5 sends the address to the fuse circuit group 6, the predecoder 8, and the row decoders 10.

The fuse circuit group 6 compares the input address and the address information programmed in the fuses. In case of the address "0001", the pair address "1001" requires the double refresh. Therefore, the hit signal is activated. However, the double refresh control circuit 7 selects the refresh operation of the pair word line "1001", which is withheld in the serial refresh selected at the previous refresh command. Therefore, the double refresh control circuit 7 sends the control signals INT 27 of a "H" level and MULTI 28 of a "L" level to the selection circuit 9. The selection circuit 9 selects the block including the pair word line "1001" so that the pair word line "1001" is refreshed. Because the pair word line is refreshed, the hold signal 25 from the double refresh control circuit 7 is inactivated. The serial refresh at the time instants T1 and T2 is completed and the serial refresh information in the double refresh control circuit 7 is reset.

Again, the predetermined time period lapses and the fourth refresh time instant T3 is reached. The controller 1 supplied with the fourth refresh command REF makes the refresh counter 3 perform the count-up operation. The refresh counter 3 delivers the count signal to the address selector 4. The address selector 4 increments the address and designates the address "0002". The address "0002" is sent to the address buffer 5. The address buffer 5 sends the address to the fuse circuit group 6, the predecoder 8, and the row decoders 10.

The fuse circuit group 6 compares the input address and the address information programmed in the fuses. In case of the input address "0002", the pair address "1002" requires the double refresh. Therefore, the hit signal is activated. Supplied with the activated hit signal, the double refresh control circuit 7 delivers the control signals INT 27 and MULTI28 to the selection circuit 9. Herein, the power supply voltage VPP is lower than the lower limit voltage Vppmin. Therefore, the serial refresh is selected. Because of the serial refresh, the hold signal 25 is activated and sent to the refresh counter 3.

In the serial refresh, the word line "0002" corresponding to the input address is refreshed in the first refresh command cycle and the pair word line "1002" is refreshed in the next refresh command cycle. Therefore, at the time instant T3, the control signals INT 27 of a "L" level and MULTI 28 of a "L" level are produced. The word line "0002" is activated and refreshed while the refresh operation of the pair word line "1002" is withheld. From the time instant T1 to the time instant T3, a single refresh operation is performed in a single cycle so that the power supply voltage VPP is increased. The power supply voltage VPP is recovered to a level not lower than the lower limit voltage Vppmin so that the refresh control signal 26 from the level detection circuit 16 is changed into a "H" level. However, at this time instant, the serial refresh is not completed and the serial refresh operation has priority. That is, the word line "0002" is refreshed in the first refresh command cycle and the pair word line "1002" is refreshed in the next refresh command cycle.

After lapse of the predetermined time period, the fifth refresh time instant T4 is reached. The fifth refresh command REF is supplied but the refresh counter 3 performs no count up operation in response to the hold signal 25. The address selector 4 does not increment the address and produces the address "0002" without change. The address "0002" is sent to the address buffer 5. The address buffer 5 sends the address to the fuse circuit group 6, the predecoder 8, and the row decoders 10.

The fuse circuit group 6 compares the input address and the address information programmed in the fuses. In case of the address "0002", the pair address "1002" requires the double refresh. Therefore, the hit signal is activated. However, the double refresh control circuit 7 selects the refresh operation of the pair word line "1002", which is withheld in the serial refresh selected in the previous refresh cycle. Therefore, the double refresh control circuit 7 sends the control signals INT 27 of a "H" level and MULTI 28 of a "L" level to the selection circuit 9. The selection circuit 9 selects the block including the pair word line "1002" so that the pair word line "1002" is refreshed. Because the pair word line is refreshed, the hold signal 25 from the double refresh control circuit 7 is inactivated.

Again, the predetermined time period lapses and the sixth refresh time instant T5 is reached. The controller 1 supplied with the sixth refresh command REF makes the refresh counter 3 perform the count-up operation. The refresh counter 3 delivers the count signal to the address selector 4. The address selector 4 increments the address and designates the address "0003". The address "0003" is sent to the address buffer 5. The address buffer 5 sends the address to the fuse circuit group 6, the predecoder 8, and the row decoders 10.

The fuse circuit group 6 compares the input address and the address information programmed in the fuses. In case of the input address "0003", the pair address "1003" requires the double refresh. Therefore, the hit signal is activated. Supplied with the activated hit signal, the double refresh control circuit 7 delivers the control signals INT 27 and MULTI 28 to the selection circuit 9. Herein, the power supply voltage VPP is already recovered to a level higher than the lower limit voltage Vppmin. Therefore, the time-division refresh is selected. The time-division refresh is selected, for example, by producing the control signals INT 27 of a "H" level and MULTI 28 of a "H" level. The word line "0003" is activated and refreshed. Successively, the pair word line "1003" is activated and refreshed.

When a seventh or a subsequent refresh command is supplied, the double refresh operation mode is selected depending upon whether the power supply voltage VPP is higher or lower than the lower limit voltage Vppmin of the design value. If the pair address compared by the fuse circuit group 6 does not require the double refresh, the hit signal is not activated. The double refresh control circuit 7 produces the control signals INT 27 of a "L" level and MULTI 28 of a "L" level. Therefore, the normal refresh is selected.

In this embodiment, it is assumed that the supply capacity of the VPP power supply circuit is designed so as to meet a single refresh operation in a single refresh command cycle. However, the supply capacity of the VPP power supply circuit is not particularly restricted. The supply capacity of the VPP power supply circuit is determined as a ratio with respect to current consumption at the normal refresh, considering the trade-off between a voltage drop in the time-division refresh and a mounting area of the VPP power supply circuit. That is, if the supply capacity of the VPP power supply circuit is increased, the time-division refresh can be continuously selected. However, the mounting area of the VPP power supply circuit is increased and a chip cost is elevated. On the other hand, if the supply capacity of the VPP power supply circuit is reduced, the mounting area of the VPP power supply circuit is decreased. However, the time-division refresh can be selected only a reduced number of times while the serial refresh is selected an increased number of times. In case of the serial refresh, the address is counted up at every two refresh commands. Therefore, the refresh cycle is lengthened in correspondence to the number of times of the serial refresh.

In this embodiment, the voltage level of the power supply voltage VPP is monitored and the double refresh is selected depending upon the voltage level. If the power supply voltage VPP is higher than the lower limit voltage Vppmin, the time-division refresh is selected in which the double refresh is performed in a time-division fashion within the one refresh command cycle. If the power supply voltage VPP is lower than the lower limit voltage Vppmin, the serial refresh is carried out in which the double refresh of the pair word line is inserted into the next refresh command cycle. By selecting the time-division refresh or the serial refresh as an optimum refresh operation mode with reference to the voltage level of the power supply voltage VPP, it is possible to suppress voltage drop of the power supply voltage. Thus, in the semiconductor device according to this invention, the optimum refresh operation mode is selected. It is therefore possible to relieve memory cells having short retention times without replacing the memory cells by redundant circuits.

Second Embodiment

Figure 4:
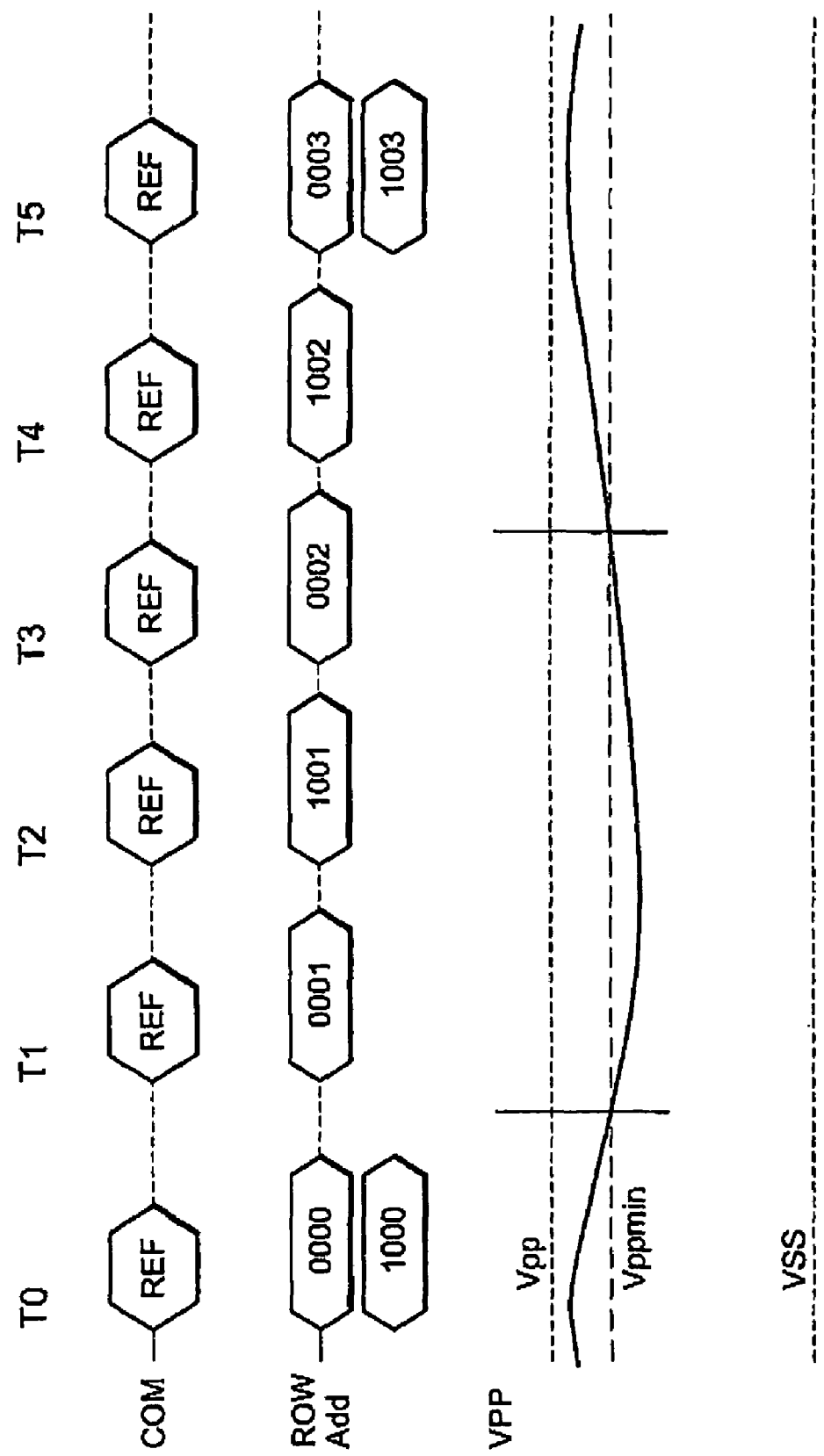
FIG. 4 is a timing chart for describing double refresh according to a second embodiment of this invention.

Referring to FIGS. 2 and 4, a second embodiment of this invention will be described. In this embodiment, when the power supply voltage VPP is higher and lower than the lower limit voltage Vppmin, parallel refresh and serial refresh are selected as the double refresh operation mode, respectively.

FIG. 4 shows the refresh commands REF as the commands (COM), the row addresses (ROW Add) selected upon input of the refresh commands REF, and the power supply voltage VPP. At the time instant T0, the first refresh command REF is supplied and the word line "0000" is refreshed. The pair word line "1000" is to be subjected to the double refresh and the double refresh is performed. At the time instant T0, the power supply voltage VPP is higher than the lower limit voltage Vppmin of the design value. Therefore, in one refresh cycle, the word line "0000" and the pair word line "1000" are simultaneously refreshed.

Thus, refreshing the word line and the pair word line simultaneously in one refresh cycle is called the parallel refresh. As the two refresh operations are simultaneously carried out, current consumption exceeds the supply capacity of the VPP power supply circuit. As a consequence, the power supply voltage VPP is lowered below the lower limit voltage Vppmin of the design value. When the power supply voltage VPP is lowered below the lower limit voltage Vppmin of the design value, the refresh control signal 26 from the level detection circuit 16 is changed into a "L" level.

In the second refresh command cycle at the time instant T1, the word line "0001" selected by the address produced by the address selector 4 is refreshed. In the third refresh command cycle at the time instant T2, the pair word line "1001" is refreshed. In the fourth refresh command cycle at the time instant T3, the word line "0002" selected by the address produced by the address selector 4 is refreshed. In the fifth refresh command cycle at the time instant T4, the pair word line "1002" is refreshed. From the input of the second refresh command REF at the time instant T1 to the input of the fifth refresh command REF at the time instant T4, the operations are similar to those at the timings in the first embodiment and detailed description thereof will be omitted herein.

At the time instant T5, the sixth refresh command REF is supplied and the word line "0003" is refreshed. The pair word line "1003" is to be subjected to the double refresh and the double refresh is performed. At the time instant T5, the power supply voltage VPP is recovered to a level higher than the lower limit voltage Vppmin. Therefore, the word line "0000" and the pair word line "1000" are simultaneously refreshed (parallel refresh) in the sixth refresh cycle.

Thus, the pair word line having a short retention time is subjected to the double refresh by the use of the parallel refresh and the serial refresh if the power supply voltage VPP is higher and lower than the lower limit voltage Vppmin, respectively. When the serial refresh is performed in case where the power supply voltage VPP is low, the power supply voltage VPP is recovered and the decrease of the power supply voltage VPP is suppressed. The double refresh operation mode is changed with reference to the power supply voltage VPP. Thus, by changing the double refresh operation mode and suppressing the decrease of the power supply voltage VPP, the memory cell having a short retention time is relieved.

Referring to FIG. 2, description will be made of an operation of each circuit block of the semiconductor device at each timing. At the time instant T0, the first refresh command REF is supplied and the controller 1 produces the refresh operation command. In response to the count signal from the refresh counter 3, the address selector 4 produces the address to be refreshed. In FIG. 4, the first address "0000" is produced and sent to the address buffer 5. The address buffer 5 supplies the address to the fuse circuit group 6, the predecoder 8, and the row decoders 10.

The fuse circuit group 6 compares the input address and address information programmed in fuses. In case of the address "0000", the pair address "1000" requires double refresh. Therefore, the hit signal is activated. Supplied with the activated hit signal, the double refresh control circuit 7 supplies the control signals INT 27 and MULTI 28 to the selection circuit 9. At the time instant T0, the power supply voltage VPP is higher than the lower limit voltage Vppmin of the predetermined design value. Therefore, the parallel refresh is selected. The parallel refresh is selected, for example, by producing the control signal INT 27 of a "L" level and MULTI 28 of a "H" level. By controlling the selection circuit 9 by the control signals INT 27 and MULTI 28, the word line "0000" and the pair word line "1000" are simultaneously activated and refreshed.

The operations of each circuit block at subsequent timings will not be described herein because the operations from the time instant T1 to the time instant T4 are similar to those from the time instant T1 to the time instant T4 in the first embodiment and the operation at the time instant T5 is similar to that at the time instant T0 in the first embodiment.

In this embodiment, the voltage level of the power supply voltage VPP is monitored and the parallel refresh or the serial refresh is selected as the double refresh operation mode with reference to the voltage level. If the power supply voltage VPP is higher than the lower limit voltage Vppmin of the predetermined design value, the parallel refresh is selected in which the double refresh is performed simultaneously within the one refresh command cycle. If the power supply voltage VPP is lower than the lower limit voltage Vppmin, the serial refresh is carried out in which the double refresh of the pair word line is inserted into the next refresh command cycle. By selecting an optimum refresh operation mode with reference to the voltage level of the power supply voltage VPP, it is possible to suppress voltage drop of the power supply voltage. Thus, in the semiconductor device according to this invention, the optimum refresh operation mode is selected. Therefore, it is possible to relieve memory cells having short retention times without replacing the memory cells by redundant circuits.

Although this invention has been described in conjunction with a few preferred embodiments thereof, this invention may be modified in various other manners within the scope of the appended claims.

What is claimed is:

1. A semiconductor device to which double refresh is applied, wherein a double refresh operation mode of said double refresh is changed with reference to a voltage level of a power supply voltage internally generated in said semiconductor device.

2. A semiconductor device according to claim 1, comprising a level detection circuit for comparing the voltage level of the power supply voltage internally generated and a lower limit voltage as a reference level to produce a refresh control signal, and a double refresh control circuit for changing the double refresh operation mode in response to the refresh control signal from the level detection circuit.

3. A semiconductor device according to claim 1, further comprising an address selector, wherein an address selected by the address selector and a pair address are refreshed in a cycle started by input of a refresh command in case where the voltage level of the power supply voltage internally generated is higher than the lower limit value, the address selected by the address selector and the pair address being refreshed in the cycle started by input of the refresh command and in a next cycle started by input of a next refresh command, respectively, in case where the voltage level of the power supply voltage is lower than the lower limit voltage.

4. A semiconductor device according to claim 3, wherein the address selected by the address selector and the pair address are refreshed in a first half and a second half of the cycle started by input of the refresh command, respectively, in case where the voltage level of the power supply voltage internally generated is higher than the lower limit voltage.

5. A semiconductor device according to claim 3, wherein the address selected by the address selector and the pair address are refreshed simultaneously in the cycle started by input of the refresh command in case where the voltage level of the power supply voltage internally generated is higher than the lower limit voltage.

6. A semiconductor device according to claim 3, further comprising a fuse circuit group which memorizes addresses requiring the double refresh, the fuse circuit group comparing the address selected by the address selector and the addresses memorized in the fuse circuit group to produce a hit signal in case where the pair address of the address selected by the address selector requires the double refresh.

7. A semiconductor device according to claim 6, further comprising a refresh counter, wherein the double refresh control circuit is supplied with the hit signal and the refresh control signal to produce a hold signal for stopping a count-up operation of the refresh counter in case where the voltage level of the power supply voltage internally generated is lower than the lower limit value.

* * * * *